(12) United States Patent
Massey

(10) Patent No.: US 7,502,983 B2
(45) Date of Patent: Mar. 10, 2009

(54) BINARY ERROR-CORRECTION CODING METHOD AND DECODING METHOD FOR TRELLIS WITH PERMUTED AND SEQUENTIAL SYMBOLS

(76) Inventor: Peter C. Massey, 53281 Martin La., South Bend, IN (US) 46635

( * ) Notice: Subject to any disclaimer, the term of this patent is extended or adjusted under 35 U.S.C. 154(b) by 530 days.

(21) Appl. No.: 11/168,265

(22) Filed: Jun. 28, 2005

(65) Prior Publication Data

US 2005/0289438 A1    Dec. 29, 2005

Related U.S. Application Data

(60) Provisional application No. 60/583,518, filed on Jun. 28, 2004.

(51) Int. Cl.
   *H03M 13/00*    (2006.01)
(52) U.S. Cl. .............. 714/755; 714/786; 714/792; 714/702
(58) Field of Classification Search ............ 714/752, 714/755, 786, 792
    See application file for complete search history.

(56) References Cited

U.S. PATENT DOCUMENTS

| | | | | |
|---|---|---|---|---|
| 5,446,747 | A * | 8/1995 | Berrou | 714/788 |
| 6,023,783 | A * | 2/2000 | Divsalar et al. | 714/792 |
| 6,289,484 | B1 * | 9/2001 | Rothberg et al. | 714/769 |
| 6,525,680 | B2 * | 2/2003 | Yamamoto et al. | 341/107 |
| 6,542,559 | B1 * | 4/2003 | Wolf | 375/340 |
| 6,643,331 | B1 * | 11/2003 | Farrell et al. | 375/261 |
| 6,725,409 | B1 * | 4/2004 | Wolf | 714/755 |
| 6,785,859 | B2 * | 8/2004 | Goldman | 714/755 |
| 6,892,335 | B2 * | 5/2005 | Gueguen | 714/701 |
| 7,000,174 | B2 * | 2/2006 | Mantha et al. | 714/790 |
| 7,240,270 | B2 * | 7/2007 | Bellier et al. | 714/746 |
| 7,257,760 | B2 * | 8/2007 | Rick et al. | 714/760 |

OTHER PUBLICATIONS

Bahl et al., "Optimal decoding of linear codes for minizing symbol error rate", IEEE Trans. on Information Theory, Mar. 1974, pp. 284-287, vol. IT-20, USA.
Massey, "Filling-in some of the decoding gap between . . . (BP) and . . . (MAP)for conv'l codes", Proc. 2004 IEEE Int'l Symp. on Inform. Theory,Jun. 27-Jul. 2, 2004,pp. 342, Chicago.

* cited by examiner

*Primary Examiner*—Esaw Abraham

(57) ABSTRACT

A binary error-correction coding method that produces certain codewords such that a collection of all valid codewords is a resulting error-correction code that can have large minimum distance. The method's assignment of codewords enables them to be represented as particular paths through a single trellis with branches labeled with permuted information symbols and permuted parity symbols in addition to conventional sequential information and parity symbols. Not all paths through trellis represent valid codewords. The resulting code is linear so real-time encoding can be implemented with a large generator matrix. Also an iterative method of error-correction decoding that is based on a single trellis with branches labeled with both permuted and sequential information and parity symbols, despite not all paths in the trellis corresponding to valid codewords.

3 Claims, 2 Drawing Sheets

BINARY ERROR-CORRECTION CODING METHOD AND DECODING METHOD FOR TRELLIS WITH PERMUTED AND SEQUENTIAL SYMBOLS

CROSS-REFERENCE TO RELATED APPLICATIONS

This application is a Nonprovional claiming the benefit of U.S. Provisional Patent Application No. 60/583,518 with filing date Jun. 28, 2004, which is hereby incorporated by reference herein in its entirety and where the terminology of "Massey Codes" and its decoding method was used to refer to the invention of this application.

BACKGROUND OF THE INVENTION

1. Field of the Invention

This invention relates to the encoding and decoding of a particular class of error-correcting codes. More specifically, the invention is a novel class of codes and a method of decoding the novel class of codes utilizing an iterative algorithm.

2. Description of Related Art

There are several types of error-correcting codes that are designed to permit a decoding method that iterates to a solution approximating an optimal decoder. These types of codes are parallel-concatenated convolutional codes (also known as turbo codes), serially-concatenated convolutional codes, self-concatenated convolutional codes, and low-density parity check codes.

Parallel-concatenated convolutional codes encode a block of binary information bits by using two or more constituent convolutional encoders to create two or more vectors of parity bits corresponding to two or more subcodes. The input to each constituent encoder is a permuted version of the vector of information bits. The vectors of parity bits may possibly be punctured to increase the overall code rate. The method of iterative decoding consists of decoding each constituent subcode seperately using the so-called forward-backward BCJR algorithm (Bahl et al., "Optimal decoding of linear codes for minimizing symbol error rate", IEEE Transactions on Information Theory, Vol. 20, pp. 284-287, March 1974) and passing the extrinsic estimates obtained for the permuted information bits among the constituent decoders for the next iteration of decoding.

Concatenated tree codes are similar to parallel-concatenated convolutional codes because the vector of information bits is used in permuted versions as the inputs to several constituent encoders. Concatenated tree codes differ from parallel-concatenated convolutional codes in that the constituent encoders may be so-called tree codes which will utilize the Belief Propagation decoding algorithm instead of the BCJR algorithm and additionally each information bit is required to be involved in the recursive-part of at least two constituent encoders.

Serially-concatenated convolutional codes encode a vector of information bits by using two constituent convolutional encoders to first create a vector of intermediate-parity bits which are appended with the information bits into a larger vector and permuted to be used as the input to a second convolutional encoder. The codeword is considered to be the information bits and the parity bits created by the second encoder (possible punctured to increase overall code rate). The method of iterative decoding consists of seperately decoding the second subcode using the so-called forward-backward BCJR algorithm to obtain extrinsic estimates for the intermediate-parity bits and the information bits, which are then passed for the decoding of the first subcode using the BCJR algorithm and the resulting extrinsic estimates are passed back for the next iteration of decoding.

Self-concatenated convolutional codes are different from serially-concatenated in that the first constituent encoder is not a convolutional encoder, but is a block encoder that simply repeats the information bits a certain number of times. All the duplicated information bits are permuted and used as the input to a convolutional encoder (possibly punctured to increase overall code rate). The iterative decoding method consists of decoding the convolutional subcode using the so-called forward-backward BCJR algorithm to obtain extrinsic estimates for all the duplications of the information bits, then the extrinsic estimates are combined and passed among duplications for the next iteration of decoding.

Low-density parity check codes are based on a binary parity check matrix with few nonzero entries. The nonzero entries on each row of the parity check matrix (for column code vectors) represent parity check functions that must be valid for a codeword. Code bits are involved in several different parity check functions. The method of iterative decoding is the so-called belief propagation algorithm which consists of computing extrinsic estimates for each parity check function, then combining estimates for duplicated code symbols and passing them to the appropriate parity check functions for the next iteration of decoding. It was shown in (Peter C. Massey, "Filling-in some of the decoding gap between Belief Propagation (BP) and Maximum A Posteriori (MAP) for convolutional codes", Proceedings of the IEEE 2004 International Symposium on Information Theory, pp. 342, Chicago, Ill., June 27-Jul. 2, 2004) that the belief propagation decoding algorithm for low density parity check codes can be considered as the BCJR decoding of a parity check convolutional subcode based on a corresponding trellis consisting of only one state per trellis section, so each section has all branches being parallel and labeled with respect to a parity check subcode, and code symbol duplications label different trellis sections along the trellis.

Significant differences exist between the codes and methods of decoding in the prior art compared to this invention's novel codes and its method of decoding. A significant difference between parallel-concatenated convolutional codes and this invention's novel codes and its method of decoding is that a parallel-concatenated convolutional code requires decoding of two or more trellises whose symbols are not duplicated within each trellis. The same difference applies to concatenated tree code. A significant difference between self-concatenated convolutional codes and this invention's novel codes and its method of decoding is that a self-concatenated convolutional code does not linearly combine vectors of encoded parity bits componentwise over the binary field and it requires decoding a trellis that is typically much longer than the size of the information vector and the trellis does not contain duplication of parity symbols, it has duplications of the information symbols only. A significant difference between serially-concatenated convolutional codes and this invention's novel codes and its method of decoding is similar to the difference for self-concatenated convolutional codes because serially-concatenated convolutional codes do not linearly combine encoded vectors of parity bits. A significant difference between decoding a low density parity check code and this invention's novel codes and its method of decoding is that this invention utilizes a decoding trellis with more than one state per trellis section and the trellis sections are not labeled as a parity check subcode.

Related Patent Documents:

The claimed cross-reference of U.S. Provisional Patent Application No. 60/583,518 with filing date Jun. 28, 2004 contains a detailed description of this invention whereby the terminology of "Massey Codes" and its decoding method refers to the invention of this nonprovisional application.

Other References:

A document that describes a symbol-duplication trellis with more than one state per trellis-section and labeled for a convolutional subcode other than a parity check subcode was written by this inventor (Peter C. Massey, "Filling-in some of the decoding gap between Belief Propagation (BP) and Maximum A Posteriori (MAP) for convolutional codes", Proceedings of the IEEE 2004 International Symposium on Information Theory, pp. 342, Chicago, Ill., Jun. 27-Jul. 2, 2004). The so-called forward-backward BCJR algorithm utilized within the invention's iterative decoding method was first described in the document (Bahl et al., "Optimal decoding of linear codes for minimizing symbol error rate", IEEE Transactions on Information Theory, Vol. 20, pp. 284-287, March 1974).

BRIEF SUMMARY OF THE INVENTION

The invention is a novel class of error-correcting binary codes called QRinv Codes and the invention is also a method of decoding the novel codes.

A binary codeword for a systematic rate ½ QRinv Code has the form (i,p) where i is a vector containing a plurality of N information bits and p is a vector containing a plurality of N parity bits. QRinv Codes can be characterized by an internal structure. The internal structure consists of two parts that are equated by a global constraint on the parity bits. Each part of the internal structure can be thought of as a separate encoder and can be represented by a matrix-multiplication. One part can be thought of as an internal encoder for the vector of information bits, which produces a resultant internal binary vector q such that i*Q=q for a binary matrix Q. The other part can be thought of as an internal encoder for the vector of parity bits, which produces a resultant internal binary vector r such that p*R=r. A global constraint selects the valid vector of parity bits to be the vector of parity bits that equates the internal vectors q and r. The encoder for a QRinv Code can be represented by the matrix-multiplication i*Q*inv(R)=p, where inv(R) is the inverse matrix of R over the binary field. In the minimal embodiment of the invention, the information-part of the internal structure consists of a permuter and two convolutional encoders whose outputs are summed together over the binary field, while the parity-part of the internal structure consists of a permuter and one convolutional encoder whose output is summed together with the parity vector over the binary field.

The method of decoding QRinv Codes is an iterative algorithm that is based on a length-N multi-state trellis whose trellis-sections are each labeled with multiple information symbol labels and multiple parity symbol labels. The trellis is referred to as a symbols-duplication trellis. For the minimal embodiment of a QRinv Code, each trellis-section is labeled with two information symbol labels and two parity symbol labels. The specific trellis labels are the synchronized components of the permuted versions and non-permuted versions of the information vector and the parity vector. The symbols-duplication trellis has the property that a valid codeword for the QRinv Code corresponds to some path through the trellis, however not every path through the trellis corresponds to a valid codeword in the QRinv Code.

The iterative method of decoding consists of utilizing the well-known BCJR algorithm during each iteration to compute extrinsic estimates for all trellis labels of the symbols-duplication trellis. The extrinsic estimates corresponding to duplicate trellis labels are combined appropriately and utilized as the a-priori estimates for the next iteration of decoding. For the minimal embodiment of a QRinv Code, the updated a-priori estimates are found by simply passing the extrinsic estimates to corresponding duplicate trellis labels. After the final iteration, binary hard-decision estimates for the parity bits and the information bits can be computed for a binary solution for the entire codeword or hard-decisions for only the information bits can be computed.

DETAILED DESCRIPTION OF THE INVENTION

The invention is a novel type of error-correcting code, refered to as a QRinv Code, and the invention is also the method of decoding QRinv Codes. This description for QRinv Codes is for a preferred embodiment of a binary code with code rate of ½ and with "internal encoders" have rates of one. The embodiment having the fewest internal encoders is first described, then a more general embodiment is described. Variations of the invention for internal encoders with rates other than one should be considered within the general form of the invention. Other variations to this description that are common to code designers such as puncturing of code symbols, using code symbols other than binary bits, concatenation with other codes, overall code rates other than ½, non-systematic versions, and etc., should be considered within the general embodiment of the invention that this application includes and protects. The description assumes the code symbols to be binary bits over the binary Galois field GF(2). The term "vector" will be synonymous with the term "vector of length N" for some finite value N and refers to a plurality of N data symbols considered as a row vector of data wherein the N components of the vector are indexed from 0 to N−1. A value for a vector of data refers to the plurality of N values for the indexed components of data symbols.

A codeword for a systematic, rate of 12, binary QRinv Code consists of a vector of N information bits, denoted as i, appended with a vector of N parity bits, denoted as p. The information vector i has the plurality of component values i(k) for k having value from 0 to N−1, while the parity vector p has the plurality of component values p(k) for k having value from 0 to N−1. For a specific value of information vector i, an encoder for a QRinv Code assigns a specific value to the parity vector p. The description for QRinv codes is based on an internal structure consisting of two seperate sets of encoders with permuters. The internal structure can also be represented by a matrix-multiplication of binary matrices.

Figure 1:
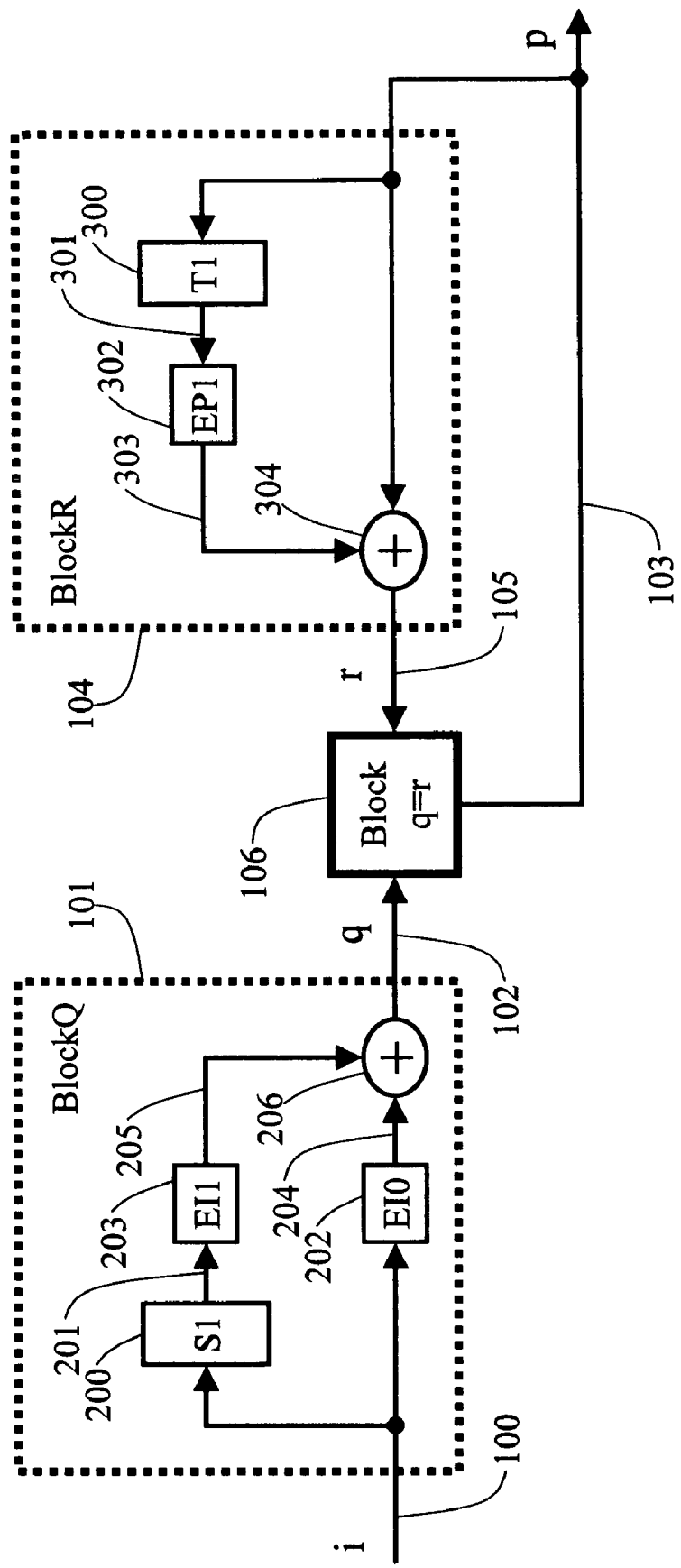
FIG. 1 is a diagram showing the internal structure of a systematic, rate ½ binary QRinv Code for the embodiment of minimal complexity having only one info-permuter and only one parity-permuter.

In FIG. 1, a block diagram for the internal structure of the simplest embodiment of a QRinv Code is shown. Referring to FIG. 1, the lines with arrows represent vectors of N binary bits and will be referred to as vectors. The vector 100 represents the vector i of information bits. The vector 103 represents the vector p of N parity bits. Element 101, labeled as BlockQ, has its input being vector 100, the vector i of information bits, and has its output being vector 102, a vector of N binary bits labeled as q. Element 104, labeled as BlockR, has its input being vector 103, the vector p of parity bits, and has its output being vector 105, the vector of N binary bits labeled as r. Element 106, labeled as Block q=r, has vectors 102 and 105 as the two separate input vectors q and r respectively. The output of element 106 is vector 103, the vector p of parity bits, wherein the function of element 106 is to assign the appropriate value to output vector p such that the resulting value for input vector r is identical to the value of input vector q, hence achieving q(k)=r(k) for k having values from 0 to N−1.

Referring to FIG. 1, the internal structures of BlockQ and BlockR are now described. BlockQ contains element 200, which is a vector permuter and labeled as S1. A vector permuter performs the function of permuting the components of an input vector according to a corresponding specified pattern to create an output vector. The input vector to permuter S1 is the information vector i, while the output vector 201 is a permuted version of the information vector i. The sequential ordering of data symbols in output vector 201 is denoted as i(S1($k$)) for values of k from 0 to N−1 where S1($k$) denotes the index of the component of the vector i which is permuted to the component k of the output vector. Permuter S1 is referred to as an info-permuter. BlockQ contains elements 202 and 203, which are truncated binary convolutional encoders labeled as EI0 and EI1 respectively, and referred to as info-encoders. Info-encoder EI0 encodes the input vector i to create output vector 204. Info-encoder EI1 encodes the permuted version of the information vector i at vector 201 to create output vector 205. The info-encoders are binary convolutional encoders with rate of one for this embodiment of the invention and are considered to be truncated in the sense that the encoded output vectors have the same number of bits as the input vector. Other variations of the invention could permit a few additional bits to the output vector, or could require fixing the values of the last few input bits. Element 206 performs the componentwise binary summation over the binary field of the encoded vectors 204 and 205 to create the said binary vector 102, denoted as q. The vector q is considered as the output vector for BlockQ with respect to the input vector i.

The internal structure of the BlockR in FIG. 1 is similar to the internal structure of BlockQ. BlockR contains element 300, which is a vector permuter, labeled as T1, and referred to as a parity-permuter. The input vector to permuter T1 is the parity vector p, while the output vector 301 is a permuted version of the parity vector p. The sequential ordering of data symbols in output vector 301 is denoted as p(T1($k$)) for values of k from 0 to N−1 where T1($k$) denotes the index of the component of the vector p which is permuted to the component k of the output vector. BlockR contains element 302, which is a truncated binary convolutional encoder, labeled as EP1, and referred to as a parity-encoder. Parity-encoder EP1 encodes the permuted version of the parity vector p at vector 301 to create output vector 303. A parity-encoder is a binary convolutional encoder with rate of one for this embodiment of the invention and is considered to be truncated in the sense that the encoded output vector 303 has the same number of bits as the input vector. Element 304 performs the componentwise binary summation over the binary field of the encoded vectors 103 and 303 to create the said binary vector 105, denoted as r. The vector r is considered as the output vector for BlockR with respect to the input vector p.

A matrix representation for the encoding of a QRinv Code is developed by representing the function of BlockQ as a binary matrix of size N by N, denoted as Q, and representing the function of BlockR as a binary matrix of size N by N, denoted as R. The function of BlockQ, with respect to input and output vectors i and q respectively, is written as the matrix-multiplication over the binary field as $i*Q=q$. The function of BlockR, with respect to input and output vectors p and r respectively, is written as the matrix-multiplication over the binary field as $p*R=r$. The function of Block q=r is shown by the equality of matrix-multiplications $i*Q=p*R$ which has the solution of $i*Q*inv(R)=p$ where the binary matrix, denoted as inv(R), is the inverse of the matrix R over the binary field such that $R*inv(R)=I$ where I is the diagonal identity matrix. The matrix-multiplication of $Q*inv(R)$ results in a binary matrix of size N by N, which is the systematic generation matrix for codewords of the QRinv Code. For the binary matrix R to be invertible, it is necessary that the matrix R have full rank, so a particular truncated encoder EP1 and a particular permuter T1 of the internal structure of the BlockR in FIG. 1 must be such that the corresponding matrix R has full rank. In order to obtain a one-to-one encoding of information vectors to parity vectors, it is also necessary that the binary matrix Q have full rank, so particular truncated encoders EI0 and EI1 and a particular permuter S1 of internal structure of BlockQ in FIG. 1 must be such that the corresponding matrix Q has full rank.

The binary matrices Q and R can be found by referring to FIG. 1 and considering the input vectors i and p for BlockQ and BlockR respectively as being each of the N singleton vectors. A singleton binary vector is a vector with one particular component having a bit value of one while all other components have a value of zero. Each of the N rows of the binary matrix Q is the resulting output vector q created by BlockQ wherein the input information vector i is set to the value of each possible singleton vector. Thus each row of matrix Q is the componentwise summation over the binary field of the encoded vectors out of the info-encoders when the information vector is set to be a singleton vector. The linearity over the binary field of the structure within BlockQ implies that an output vector q corresponding to some possible input information vector i is the result of the matrix-multiplication $i*Q=q$ over the binary field. Similarly, each of the N rows of the binary matrix R is the resulting output vector r created by BlockR for the input vector p being set the value of a singleton parity vector p. Thus each row of matrix R is the componentwise summation over the binary field of the parity vector and the encoded vector out of the parity-encoder for when the parity vector is set to be a singleton vector. The linearity over the binary field of the structure within BlockR implies that the output vector r corresponding to some possible parity vector p is the result of the matrix-multiplication $p*R=r$ over the binary field.

In FIG. 1, an embodiment of a QRinv Code is shown that utilizes the minimum number of truncated binary convolutional encoders for the internal structure of BlockQ and for the internal structure of BlockR. A more general embodiment of BlockQ for a QRinv Code utilizes a set of A info-permuters with a set of A+1 truncated binary convolutional info-encoders. The output vectors of the A info-permuters are different permuted versions of the information vector i, and are encoded by A of the set of A+1 info-encoders. The remaining info-encoder encodes the non-permuted information vector i. The A+1 encoded output vectors are summed together componentwise to create the output vector q for BlockQ. Similarly, a more general embodiment of BlockR utilizes a set of B parity-permuters with a set of B truncated binary convolutional parity-encoders. The output vectors of the B parity-permuters are different permuted versions of the parity vector p, and are encoded by the set of B parity-encoders. The non-permuted parity vector p and the B encoded output vectors are summed together componentwise to create the output vector r for BlockR. The function of Block q=r remains the same by assigning the appropriate value to vector p such that the resulting value of vector r is identical to the value of vector q. Notice that when A=1 and B=1, then the embodiment of a QRinv Code is as shown in FIG. 1.

The method of decoding a QRinv Code is based on a certain type of multi-state trellis that corresponds appropriately to the internal structure of a QRinv Code. The description for the creation of the corresponding trellis, referred to as the symbols-duplication trellis for a QRinv Code, is now described for the embodiment of a QRinv Code shown in FIG. 1. Referring to FIG. 1, grouping together the synchronized components of the vectors 201, 100, 301, and 103 respectively creates the N sets of synchronized component symbols {i(S1(k)), i(k), p(T1(k)), p(k)} for k having value of 0 to N−1. Each information symbol, i(k) for k having value of 0 to N−1, will occur within two of the sets of synchronized component symbols when it is assumed that the info-permuter S1 does not have S1(k) equaling k for k having value 0 to N−1. Similarly, each parity symbol, p(k) for k having value of 0 to N−1, will occur within two of the sets of synchronized component symbols when it is assumed that the parity-permuter T1 does not have T1(k) equaling k for k having value 0 to N−1. A virtual binary convolutional code of rate ¾ is considered wherein the three separate input vectors are encoded seperately with three binary convolutional encoders with rate one and being identical to the encoders EI1, EI0, and EP1, and wherein the single output vector results from the component-wise summation over the binary field of the outputs of the three separate encoders. A trellis for decoding this virtual convolutional code of rate ¾ is constructed in the manner of standard coding theory. At each trellis-section of the length-N trellis, binary 4-tuples appropriately label each branch between a pair of states. At each sequential trellis-section, the four corresponding trellis labels are assigned to be the sequential sets of synchronized component symbols {i(S1(k)), i(k), p(T1(k)), p(k)} for k having value of 0 to N−1. The resulting trellis is referred to as a symbols-duplication trellis. For each of the N information symbols, two identical trellis labels exist at two trellis-sections somewhere along the trellis. For each of the N parity symbols, two identical trellis labels exist at two trellis-sections somewhere along the trellis.

Figure 2:
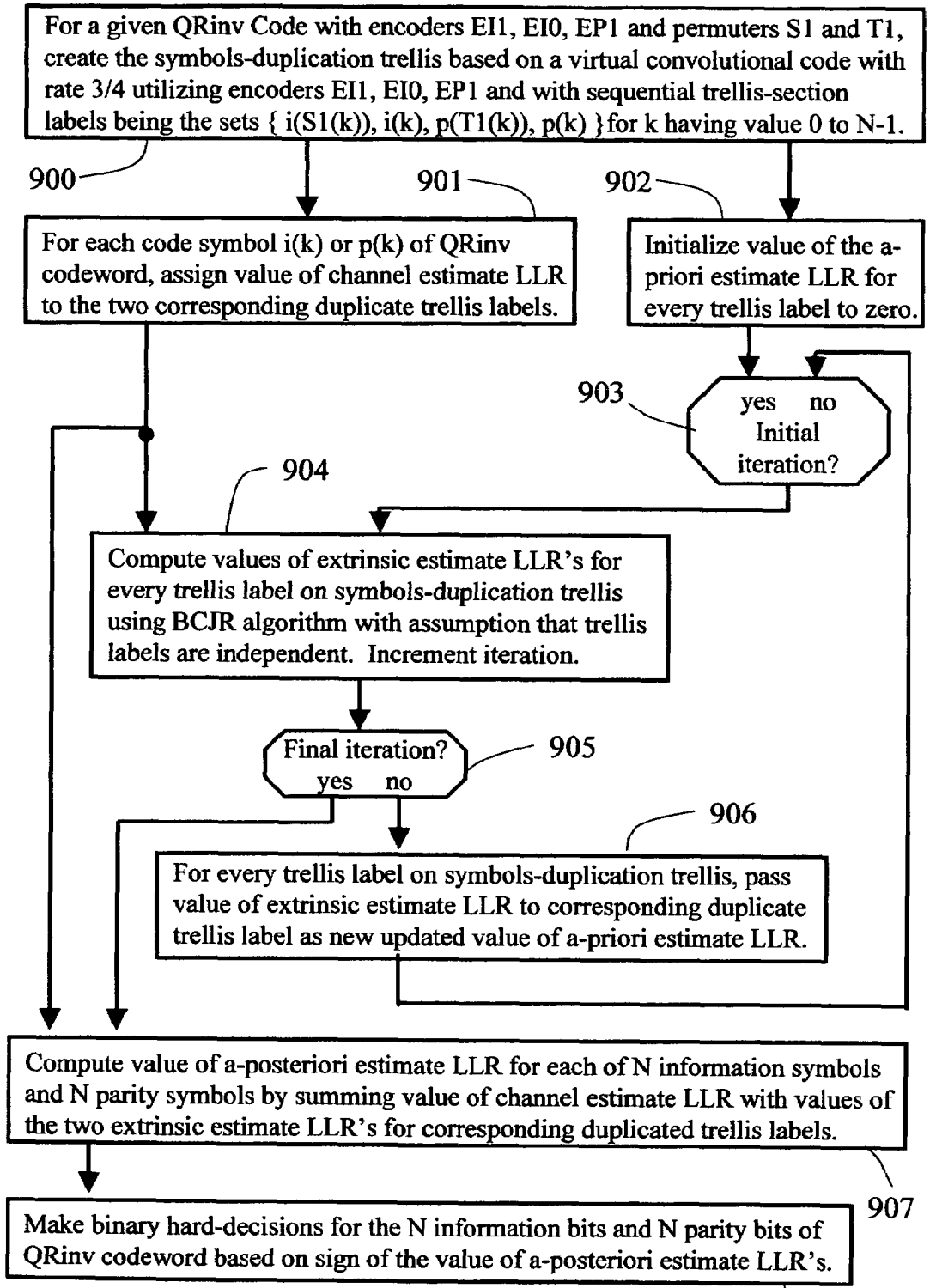
FIG. 2 is a flowchart showing the iterative algorithm for the method of decoding a QRinv Code.

The invention's method of decoding is an iterative algorithm described by the flowchart of FIG. 2 for the embodiment of a QRinv Code as shown in FIG. 1 with the permuters S1 and T1 and the binary convolutional encoders EI1, EI0, and EP1. Referring to FIG. 2, element 900 in the decoding method's flowchart indicates that the appropriate symbols-duplication trellis has been created for a particular set of permuters and encoders. The symbols-duplication trellis has two identical trellis labels corresponding to each of the N information symbols and has two identical trellis labels corresponding to each of the N parity symbols. The symbols-duplication trellis has the property that every possible codeword in the QRinv Code corresponds to some path through the trellis, however not every path through the trellis is a valid codeword because the trellis does not enforce the constraint that trellis labels corresponding to the same code symbol have equal values. Referring to FIG. 2, element 901 in the flowchart indicates that the channel values corresponding to noisy code symbols are computed as log-likelihood ratios (LLR's) and assigned to the pairs of corresponding trellis labels that label the symbols-duplication trellis. LLR's are assumed for values of estimates in the decoding method without a loss in generality. The function of element 902 of the flowchart is to initialize the values of the a-priori estimate LLR's to zero for all trellis labels on the symbols-duplication trellis. Element 903 indicates that for the initial iteration of the decoding method the initial values of zero are to be utilized for the a-priori values of all trellis labels. The function of element 904 in the flowchart indicates the utilization of the BCJR algorithm, which is well-known in coding theory literature, to compute the extrinsic estimate LLR's for every trellis label on the symbols-duplication trellis. All trellis labels, even duplicated labels, are treated as separate and independent random variables. If the final iteration has not been completed, then element 905 indicates that the function of element 906 is to be performed. The function of element 906 is based on the constraint that duplicated trellis labels correspond to the same code symbol. The function of element 906 of the flowchart is to assign the value of the extrinsic estimate LLR for each trellis label as the value of the a-priori estimate LLR for the duplicate trellis label corresponding to the same code symbol in preparation for the next iteration of the BCJR algorithm. Element 903 indicates that all following iterations utilize the updated values for the a-priori estimate LLR's. Each iteration of the decoding algorithm performs the functions of the elements 904 and 906, so for the symbols-duplication trellis, the BCJR algorithm uses the updated a-priori estimate LLR's from the previous iteration, along with the channel estimate LLR's, to compute the resulting extrinsic estimate LLR's which are then swapped between duplicate trellis labels to give the new updated a-priori estimate LLR's. A certain number of iterations is given either as a fixed number of iterations for every codeword, or by using some type of stopping rule. When the final iteration of the BCJR algorithm has been performed for the symbols-duplication trellis, then element 905 of the flowchart indicates that the function of element 907 is performed next. The function of element 907 is to compute the values of the a-posteriori estimate LLR's for each code symbol by summing the value of the channel estimate LLR with the two values of extrinsic estimate LLR's for the duplicate trellis labels corresponding to the same code symbol. The function of element 908 is to make binary hard-decisions for each code symbol of the QRinv codeword depending on the sign of the value of the corresponding a-posteriori estimate LLR. If desired, the decoded codeword can be checked whether the solution is a valid codeword of the QRinv Code. The decoded binary information bits are the hard-decision estimates for information symbols from element 908.

The method of decoding for a QRinv Code that has an embodiment with more than one info-permuter is similar to the iterative method shown in the flowchart of FIG. 2 except that there will be more than two duplicate trellis labels corresponding to information symbols. The function of element 906 of computing the a-priori estimate LLR's is changed from the function of simply passing the extrinsic estimate LLR of the other duplicate trellis label to become the function of summing the extrinsic estimate LLR's of the other duplicate trellis labels and then passing the resulting sum as the a-priori estimate LLR for the trellis label. Similarly, for an embodiment of a QRinv Code that has more than one parity-permuter, there will be more than two duplicate trellis labels corresponding to parity symbols and the function of element 906 is changed to sum the extrinsic estimate LLR's of the other duplicate trellis labels and then pass the resulting sum as the a-priori estimate LLR.

I claim:

1. A method for error-correction coding, for a given number of N bits, of a given value for a binary vector of N information bits wherein a codeword value is assigned for a vector of N parity bits, and wherein the method comprises the steps of:

(a) encoding the said vector of N information bits, by using a first binary convolutional encoder, to create an output vector, which the output is a first truncated output to a vector of N bits;

(b) permuting the said vector of N information bits, with respect to a first permutation, to create a vector of N permuted information bits;

(c) encoding the said vector of N permuted information bits, by using a second binary convolutional encoder, to create an output vector, which the output is a second truncated output to vector of N bits;

(d) setting a first internal binary vector of N bits equal to a result value from binary addition of:

the said first truncated output vector of N bits from the first binary convolutional encoder;

and the said second truncated output vector of N bits from the second binary convolutional encoder;

(e) permuting the said vector of N parity bits, with respect to a second permutation, to create a vector of N permuted parity bits;

(f) encoding the said vector of N permuted parity bits, by using a third binary convolutional encoder, to create an output vector, which the output is a third truncated output to a vector of N bits; and (g) setting a second internal binary vector of N bits equal to a result value from binary addition of:

the said vector of N parity bits;

and the said third truncated output vector of N bits from the third binary convolutional encoder;

and wherein the said codeword value is assigned to equalize the value of the said vector of N parity bits for which a result value for the said second internal binary vector of N bits is equal to the value for the said first internal binary vector of N bits, and wherein an encoding to produce the said codeword value is a matrix multiplication of a binary generator matrix value, which is stored in a memory, multiplying the said given value of said binary vector of N information bits.

2. The method of error-correction coding of claim 1, wherein the said binary addition of said step (d) further including one or more additional truncated vectors of N bits, each said additional truncated vector of N bits is created by permuting the said vector of N information bits, with respect to an additional permutation, to create an additional vector of N permuted information bits which is encoded, by using an additional binary convolutional encoder, to create another output vector, which the output is an additional truncated output to a vector of N bits.

3. The method of error-correction coding of claim 1, wherein the said binary addition of said step (g) further including one or more additional truncated vectors of N bits, each said additional truncated vector of N bits is created by permuting the said vector of N parity bits, with respect to an additional permutation, to create an additional vector of N permuted parity bits which is encoded, by using an additional binary convolutional encoder, to create another output vector, which the output is an additional truncated output to a vector of N bits.

* * * * *